United States Patent
Loccia et al.

(10) Patent No.: US 11,002,767 B2
(45) Date of Patent: May 11, 2021

(54) CURRENT SENSING FOR MONITORING LOAD CURRENT IN A BUCK POWER CONVERTER

(71) Applicant: Infineon Technologies AG, Neubiberg (DE)

(72) Inventors: Giuseppe Loccia, Maenza (IT); Marco Flaibani, Montegrotto Terme (IT)

(73) Assignee: Infineon Technologies AG, Neubiberg (DE)

( * ) Notice: Subject to any disclaimer, the term of this patent is extended or adjusted under 35 U.S.C. 154(b) by 111 days.

(21) Appl. No.: 16/354,659

(22) Filed: Mar. 15, 2019

(65) Prior Publication Data

US 2020/0292586 A1 Sep. 17, 2020

(51) Int. Cl.
*G01R 19/00* (2006.01)
*G05F 3/26* (2006.01)
*H02M 1/088* (2006.01)
*H02M 3/158* (2006.01)
*H02M 1/00* (2006.01)

(52) U.S. Cl.
CPC .......... *G01R 19/003* (2013.01); *G05F 3/262* (2013.01); *H02M 1/088* (2013.01); *H02M 3/1582* (2013.01); *H02M 2001/0009* (2013.01)

(58) Field of Classification Search
None
See application file for complete search history.

(56) References Cited

U.S. PATENT DOCUMENTS

2010/0327825 A1* 12/2010 Mehas ................ H02M 3/1588
323/266

OTHER PUBLICATIONS

Texas Instruments, "Wide Input Range Synchronous Buck Controller With Analog Current Monitor," LM25117-Q1, Apr. 2011, 45 pp.

* cited by examiner

*Primary Examiner* — Jeffrey A Gblende
*Assistant Examiner* — Henry E Lee, III
(74) *Attorney, Agent, or Firm* — Shumaker & Sieffert, P.A.

(57) ABSTRACT

The disclosure describes techniques for measuring the average output current of a power converter circuit by determining peaks valleys in the output current. A current monitoring circuit may include an averaging unit, which may sample the output current during a current peak as well as during a current valley. During a hold phase the averaging unit may output a signal proportional to the average output current based on the sampled peak current and sampled valley current. In some examples, the averaging unit may include three functional units. A first unit may be configured to determine the output current, a second block may be configured to hold the previously determined peak current and a third block may be configured to hold the previously determined valley current. In this manner the averaging unit may continuously output a signal proportional to the average output current of the power converter.

20 Claims, 9 Drawing Sheets

CURRENT SENSING FOR MONITORING LOAD CURRENT IN A BUCK POWER CONVERTER

TECHNICAL FIELD

The disclosure relates to power converter circuits.

BACKGROUND

It is often desirable to determine the average current delivered by a power converter. Some techniques may be inaccurate or require detailed information about the properties of components of the power converter. In the example of power converters implemented using integrated circuits, techniques for determining the average current of the power converter may require additional external components, which may be undesirable.

SUMMARY

In general, the disclosure is directed to techniques for measuring the average output current of a power converter circuit. Some examples of output current include a varying waveform that may include peaks and valleys. The output current monitoring circuit of this disclosure may determine the peak current and the valley current and continually provides an output signal proportional to the average output current of the power converter.

In one example, the disclosure is directed to a circuit comprising a first current sampling unit, a second current sampling unit, and an output unit. The circuit may be configured to sample an input current during a first phase of a first time period with the first current sampling unit and sample the input current during a first phase of a second time period with the second current sampling unit. The first phase of the first time period does not overlap the first phase of the second time period. During a second phase of the first time period, provide a first current to the output unit from the first current sampling unit. The first current defines a magnitude that is based on the input current during the first phase of the first time period. During a second phase of the second time period, provide a second current to the output unit from the second current sampling unit. Similarly, the second current defines a magnitude that is based on the input current during the first phase of the second time period. Finally, output a signal from the output unit, wherein the signal is based on the first current and the second current.

In another example, the disclosure is directed to method that comprises sampling, with a first current sampling unit of a current monitoring circuit, an input current during a first phase of a first time period, and sampling, with a second current sampling unit of the current monitoring circuit, the input current during a first phase of a second time period, wherein the first phase of the first time period does not overlap the first phase of the second time period. During a second phase of the first time period, the method may further include providing, by the first current sampling unit, a first current to an output unit of the current monitoring circuit, wherein the first current defines a magnitude that is based on the input current during the first phase of the first time period. During a second phase of the second time period, the method may include providing, by the second current sampling unit, a second current to the output unit from the second current sampling unit, wherein the second current defines a magnitude that is based on the input current during the first phase of the second time period. Finally, the method includes outputting a signal from the output unit, wherein the signal is based on the first current and the second current.

In another example, the disclosure is directed to a system comprising a power converter circuit with a current monitoring circuit. The current monitoring circuit may a current sense unit configured to mirror the output current of the power converter circuit, and an averaging unit comprising a first current sampling unit, a second current sampling unit, and an output unit. The averaging unit may be configured to: receive the mirrored current from the current sense unit as an input current, sample the input current during a first phase of a first time period with the first current sampling unit, sample the input current during a first phase of a second time period with the second current sampling unit, wherein the first phase of the first time period does not overlap the first phase of the second time period. During a second phase of the first time period, provide a first current to the output unit from the first current sampling unit, wherein the first current defines a magnitude that is based on the input current during the first phase of the first time period. During a second phase of the second time period, provide a second current to the output unit from the second current sampling unit, wherein the second current defines a magnitude that is based on the input current during the first phase of the second time period. Finally, the current monitoring circuit may output a signal from the output unit, wherein the signal is based on the first current and the second current.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to techniques for measuring the average output current of a power converter circuit. The output current monitoring circuit of this disclosure may determine peaks in the output current and the valleys in the output current and continually provide an output signal proportional to the average output current of the power converter. The output current monitoring circuit may include an output current monitoring unit and an averaging unit, which may be embedded with the power converter. The averaging unit may sample the output current during a current peak and output the determined peak current during a hold phase. The averaging unit may also sample the output current during a current valley and output the determined valley current during a hold phase. During the hold phase the averaging unit may output the signal proportional to the average output current based on the sampled peak current and valley current. In some examples, the averaging unit may include three functional units, which may also be referred to as functional blocks. At a selected time, a first unit may be configured to determine the power converter circuit output current, a second unit may be configured to hold the previously determined peak current and a third unit may be configured to hold the previously determined valley current. In this manner the averaging unit may continuously output a signal proportional to the average output current of the power converter.

Figure 1:
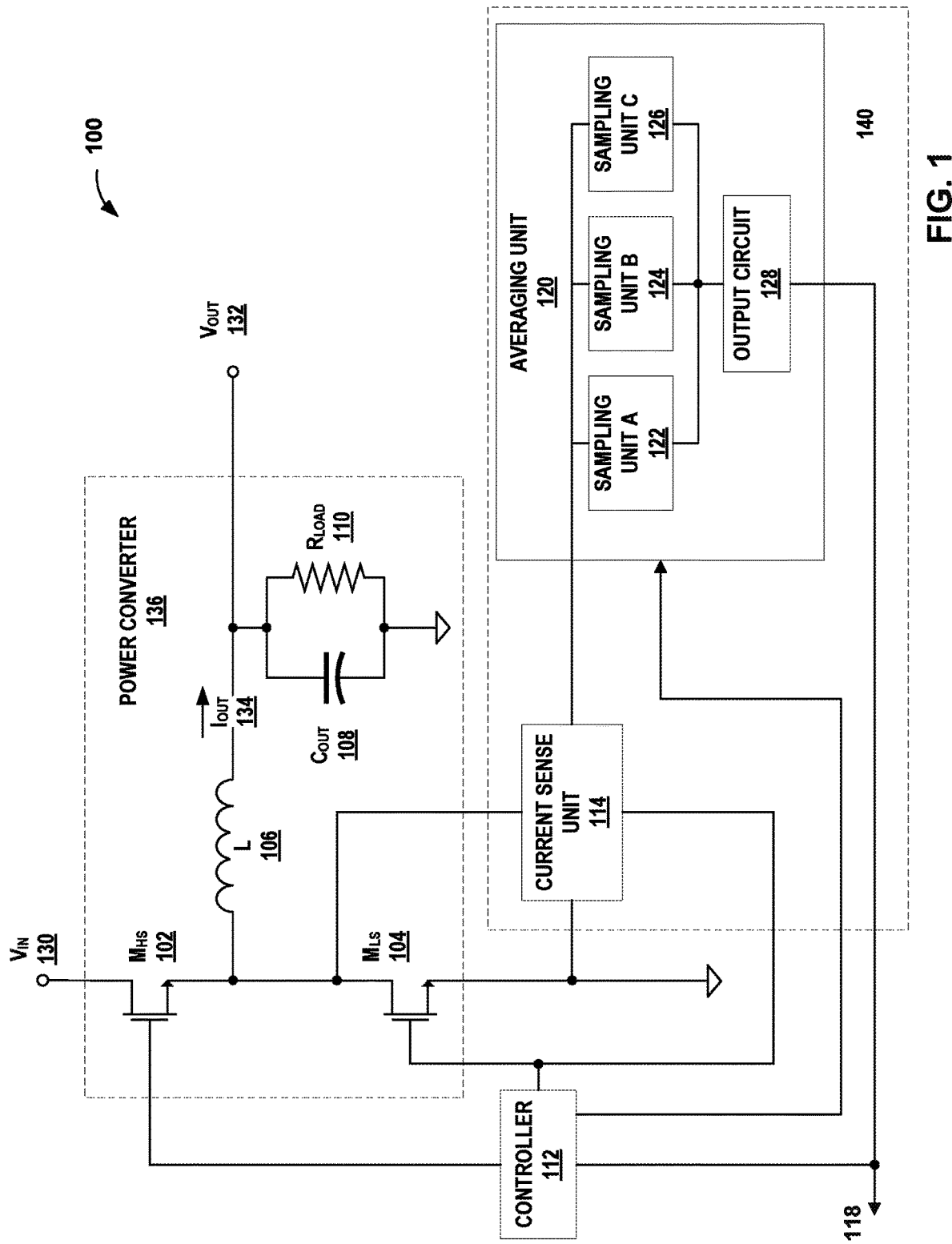
FIG. 1 is a block diagram illustrating a system including a power converter circuit and an output current monitoring circuit of this disclosure.

FIG. 1 is a block diagram illustrating a system including a power converter circuit and an output current monitoring circuit of this disclosure. System 100, in the example of FIG. 1, includes a buck power converter circuit 136, which may be used in a variety of DC-DC applications. The techniques of this disclosure may also be useful when applied to other types of power converters, such as a boost converter, a buck-boost converter, a double-switch forward or two-switch forward converter, and an active clamp forward converter.

System 100 includes controller 112, power converter circuit 136, and current monitoring circuit 140. System 100 may receive an input voltage Vin 130 and output a second voltage Vout 132. Current monitoring circuit 140 may output a signal proportional to the average output current Iout 134. The signal 118 from current monitoring circuit 140 may be received by controller 112, as well as by other portions of a larger system of which system 100 is a part.

Power converter circuit 136 comprises a buck power converter that includes a high side transistor $M_{HS}$ 102 and a low side transistor $M_{LS}$ 104, a coil, or inductor L 106, an output network comprising output capacitor Cout 108 and resistor Rload 110. In the example of system 100, high side transistor $M_{HS}$ 102 and low side transistor $M_{LS}$ 104 are N-channel metal oxide semiconductor field effect transistors (MOSFET). The drain of $M_{HS}$ 102 connects to Vin 130 while the source of $M_{HS}$ 102 connects to the drain of $M_{LS}$ 104 and inductor L 106. The opposite terminal of L 106 connects to the power converter output Vout 132 as well as to the parallel combination of Cout 108 and Rload 110. The parallel combination of Cout 108 and Rload 110 connects Vout 132 to ground. The source of $M_{LS}$ 104 connects to ground. In some examples, Rload 110 may represent the load on power converter 136. In other examples a separate load may connect to Vout 132 and Rload 110 may be omitted. The load connected to power converter 136, i.e. that receives Iout 134, may be, for example, another power converter, a sensor, a microprocessor, or some other load.

Controller 112 connects to the gates of high side transistor $M_{HS}$ 102 and low side transistor $M_{LS}$ 104. Controller 112 may send gate control signals to adjust the operation of high side transistor $M_{HS}$ 102 and low side transistor $M_{LS}$ 104 to control the magnitude of output voltage and magnitude of output current Iout 134 at Vout 132. In some examples controller 112 and current monitoring circuit 140 may be implemented on a single controller integrated circuit (IC).

Controller 112 may be implemented as any one or more of a microcontroller (MCU), e.g. a computer on a single integrated circuit containing a processor core, memory, and programmable input/output peripherals, a microprocessor (μP), e.g. a central processing unit (CPU) on a single, a controller, a digital signal processor (DSP), an IC, an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry.

Current monitoring circuit 140, which may also be referred to as monitoring circuit 140, includes a current sense unit 114 and averaging unit 120. Monitoring circuit 140 may receive one or more signals from power converter 136 to determine the magnitude of output current Iout 134. Based on the signals from power converter circuit 136, monitoring circuit 140 may output the signal proportional to the average output current Iout 134.

Current sense unit 114 is configured to mirror the output current Iout 134 of power converter circuit 136. In the example of system 100, current sense unit is configured to mirror the current through low side transistor $M_{LS}$ 104. Therefore, current sense unit 114 connects to the source and the drain of $M_{LS}$ 104. Current sense unit 114 may also receive the gate signal to $M_{LS}$ 104 sent by controller 112.

In other examples, current sense unit 114 may receive signals from other portions of power converter unit 136. For example, current sense unit 114 may connect to the source and drain of high side transistor $M_{HS}$ 102, as well as receive the gate signal to high side transistor $M_{HS}$ 102.

Averaging unit 120, in the example of system 100, includes three sampling units, sampling unit A 122, sampling unit B 124 and sampling unit C 126. In other examples, an averaging unit may include two sampling units or include four or more sampling units. Averaging unit 120 may also include output circuit 128.

In operation, averaging unit 120 may be configured to receive the mirrored current from current sense unit 114 as an input current to each sampling unit. Averaging unit 120 may be configured to sample the input current from current sense unit 114 during a first phase of a first time period with the first current sampling unit, e.g. sampling unit A 122. During a first phase of a second time period, averaging unit 120 may be configured to sample the input current with a second current sampling unit, e.g. sampling unit B 124. In the example of system 100, the first phase of the first time period does not overlap the first phase of the second time period, however, other portions or phases of the first time period may overlap with other portions or phases of the second time period.

During a second phase of the first time period, the first current sampling unit, sampling unit A 122, may provide a first current or a first voltage to output unit 128. This first current, or first voltage, may defines a magnitude that is based on the input current during the first phase of the first time. Because the input current from current sense unit 114 is based on output current Iout 134, this first current, or first voltage, may defines a magnitude that is based on Iout 134 during the first phase of the first time. In other words, this first current, or first voltage, may be a signal proportional to the magnitude of Iout 134. In some examples, the magnitude of Iout 134 during the first phase of the first time may be a relative peak magnitude of Iout 134.

During a second phase of the second time period, the second current sampling unit, sampling unit B 124, may provide a second current, or a second voltage, to output unit 128. Similar to the first current, or the first voltage, described above, the second current, or second voltage may define a magnitude that is based on the input current from current sense unit 114 during the first phase of the second time period. As with the first current or first voltage, this second current, or second voltage, may be a signal proportional to the magnitude of Iout 134. In some examples, the magnitude of Iout 134 during the first phase of the second time period may be a relative valley magnitude of Iout 134.

Averaging unit 120 may combine the signal from sampling unit A 122 and sampling unit B 124 to generate a signal 118 based on the first current and the second current (or first voltage and second voltage). Averaging unit 120 may output signal 118 from output unit 128. In some examples, the signal is proportional to an average magnitude of output current Iout 134. In other words, averaging unit 120 may combine the signal indicating the relative peak current of Iout 134 with the signal indicating the relative valley current of Iout 134 to generate the output signal, e.g. signal 118, from output circuit 128 that represents the average current of Iout 134.

In some examples, averaging unit 120 may sample the input current from current sense unit 114 during a first phase of a third time period with the third current sampling unit, sampling unit C 126. In the example of system 100 the first phase of the third time period does not overlap the first phase of the first time period nor the first phase of the second time period. However other portions or phases of the third time period may overlap with other portions or phases of the second time period and the first time period.

In some examples, while sampling unit C 126 is sampling the input current from current sense unit 114, during the first phase of the third time period, Sampling unit A 122 and sampling unit B 124 may be providing the first current and the second current, respectively (or first voltage and second voltage) to output unit 128. For example, sampling unit A 122 may provide the first current/voltage to output unit 128, in which the magnitude of the first current/voltage defines the current peak of Iout 134. Output circuit 128 may combine the signal from sampling unit A 122 with the signal from sampling unit B 124, in which the magnitude of the second current/voltage defines the current valley of Iout 134. Output current may generate a signal based on the signal from sampling unit A 122 and sampling unit B 124, in which the signal indicates the average magnitude of Iout 134, during the time sampling unit C 126 is sampling the input current from current sensed unit 114. In this manner, current monitoring circuit 140 may continuously output the signal from output unit 128 to controller 112 indicating the average magnitude of Iout 134.

Figure 2:
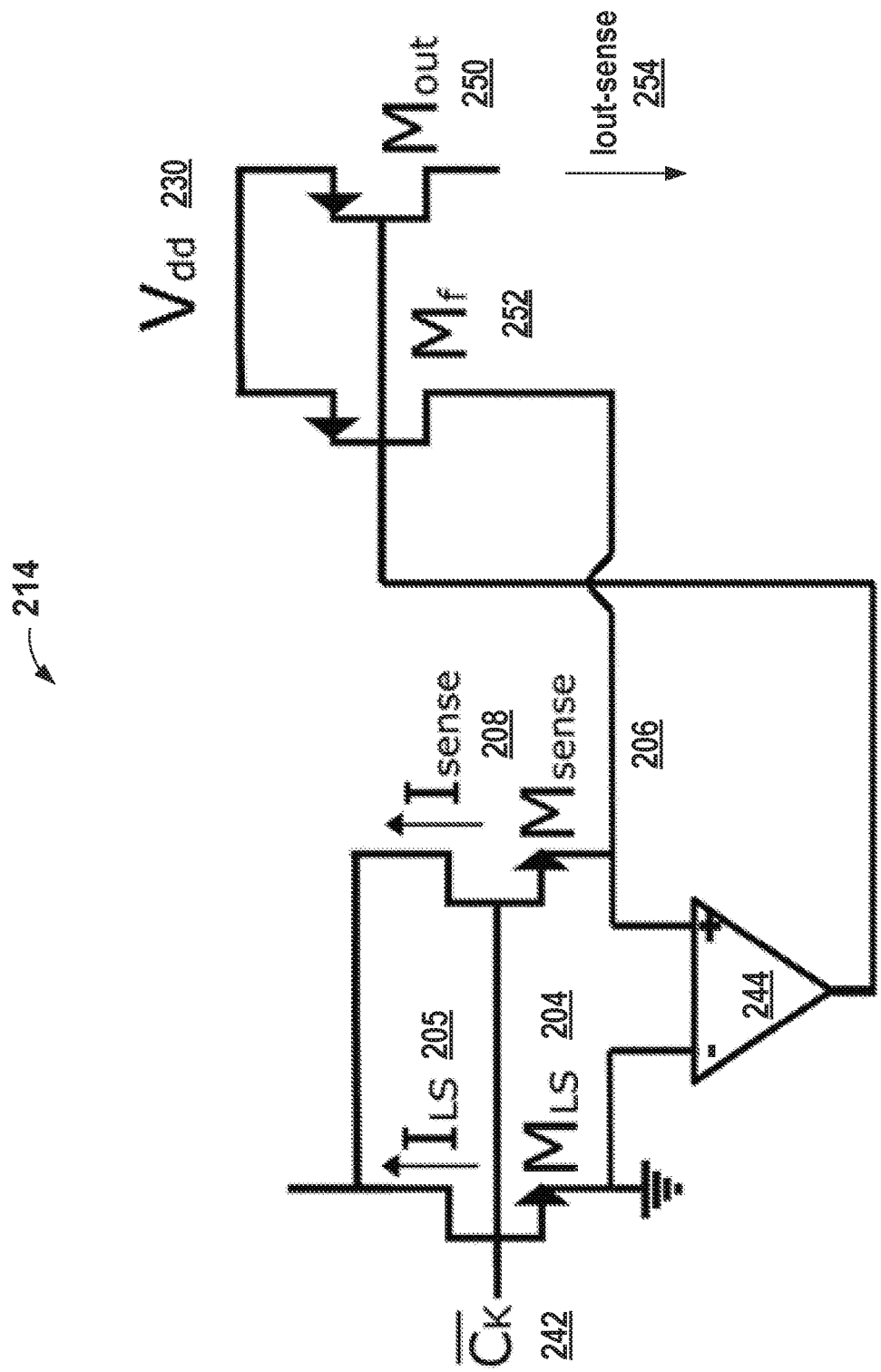
FIG. 2 is a schematic diagram illustrating an example implementation of the current sensing circuit of this disclosure.

FIG. 2 is a schematic diagram illustrating an example implementation of the current sensing circuit of this disclosure. Current sensing circuit 214 is an example implementation of current sensing circuit 114 described above in relation to FIG. 1.

Current sensing circuit 214 includes two current mirrors and an amplifier. The first current mirror includes low side transistor $M_{LS}$ 204 with Msense 206. Msense 206 may be a scaled version of $M_{LS}$ 204 and connected to have same gate and drain voltages. Low side transistor $M_{LS}$ 204 is an example of low side transistor $M_{LS}$ 104 described above in relation to FIG. 1. As described above in relation to FIG. 1, Msense 206 may also be configured to mirror the current in high side transistor $M_{HS}$ 102. Gate control signal, e.g. clock signal, $\overline{CK}$ 242 connects to the gates of both $M_{LS}$ 204 and Msense 206 and may come from controller 112, described above in relation to FIG. 1.

The source of $M_{LS}$ 204 connects to the inverting input to amplifier 244. The source of Msense 206 connects to the non-inverting input of amplifier 244. The output of amplifier 244 provides the gate signal to the second current mirror comprising transistor Mf 252 and Mout 250. This results in Isense 208 through Msense 206 being mirrored as Iout-sense 254 from Mout 250. the sources of Mf 252 and Mout 250 connect to the power supply Vdd 230. In some examples Vdd 230 may be electrically connected to Vin 130.

In operation, the same source voltage of $M_{LS}$ 204 is imposed on Msense 206 through amplifier 244 and Mf 252. In this way, the current through Msense 206 and Mf 252, i.e. Isense 208, is approximately equal to the current passing through the buck converter low side switch $M_{LS}$ 204. The copied current is sent to the output of current sensing circuit 214 through Mout 250 as Iout-sense 254. In this way Iout-sense 254 is made available for averaging unit 120, described above in relation to FIG. 1.

In some examples, current sense circuit 214 may be configured to perform a division by two, in order to calculate the average current. For example, one or both current mirrors in current sense circuit 214 may be configured such that the magnitude of Iout-sense 254 is half of the magnitude of the output current, e.g. Iout 134 described above in relation to FIG. 1. In other words, the input current may be divided to calculate the average, rather than dividing the output to calculate the average.

Using a current sensing circuit, such as current sensing circuit 214 may have advantages over other techniques to estimate the average output current of a power converter, e.g. a buck converter in constant current mode (CCM). For example, it is possible to use a resistor in series with the low side or high side switch. However, such a shunt resistor may have the disadvantage of having a high power dissipated across the shunt because, this resistance could be crossed by high currents. Another technique may consider the $R_{on}$ of the either the high side or low side switch, e.g. a MOSFET, of the buck converter and measure the voltage drop across the MOSFET. However, estimating current by measuring the voltage drop may not be accurate because this resistance $R_{on}$ may be non-linear, and may vary greatly with the manufacturing process of the MOSFET and the operating temperatures of the power converter.

Another technique may use an RC filter mounted in parallel to the inductor, e.g. L 106 depicted in FIG. 1. The RC filter may be used to obtain at the ends of the capacity a voltage proportional to the average current that passes through the inductor. The problem with this technique is the need to know precisely the value of the inductance and equivalent resistance series $R_L$. It is also necessary to add an additional pin to read the voltage on the capacity.

In contrast, the addition of current sensing circuit 214 to a power converter controller IC may not require any additional pins to facilitate measurement of power converter output current. That is, in the example of the shunt resistor technique described above, a controller IC may require one or more pins to measure the voltage across the shunt resistor. Similarly, for the RC network described above, a controller IC may require one or more pins to monitor the RC network. In contrast, the techniques of this disclosure may allow for current measurement of the power converter output without the need for any additional dedicated pins. In addition, the techniques of this disclosure may not require precise knowledge of the inductance or resistance values of the high side or low side switches, may sample a load current that varies from low to high magnitude and consumes little power, without losing accuracy.

Figure 3:
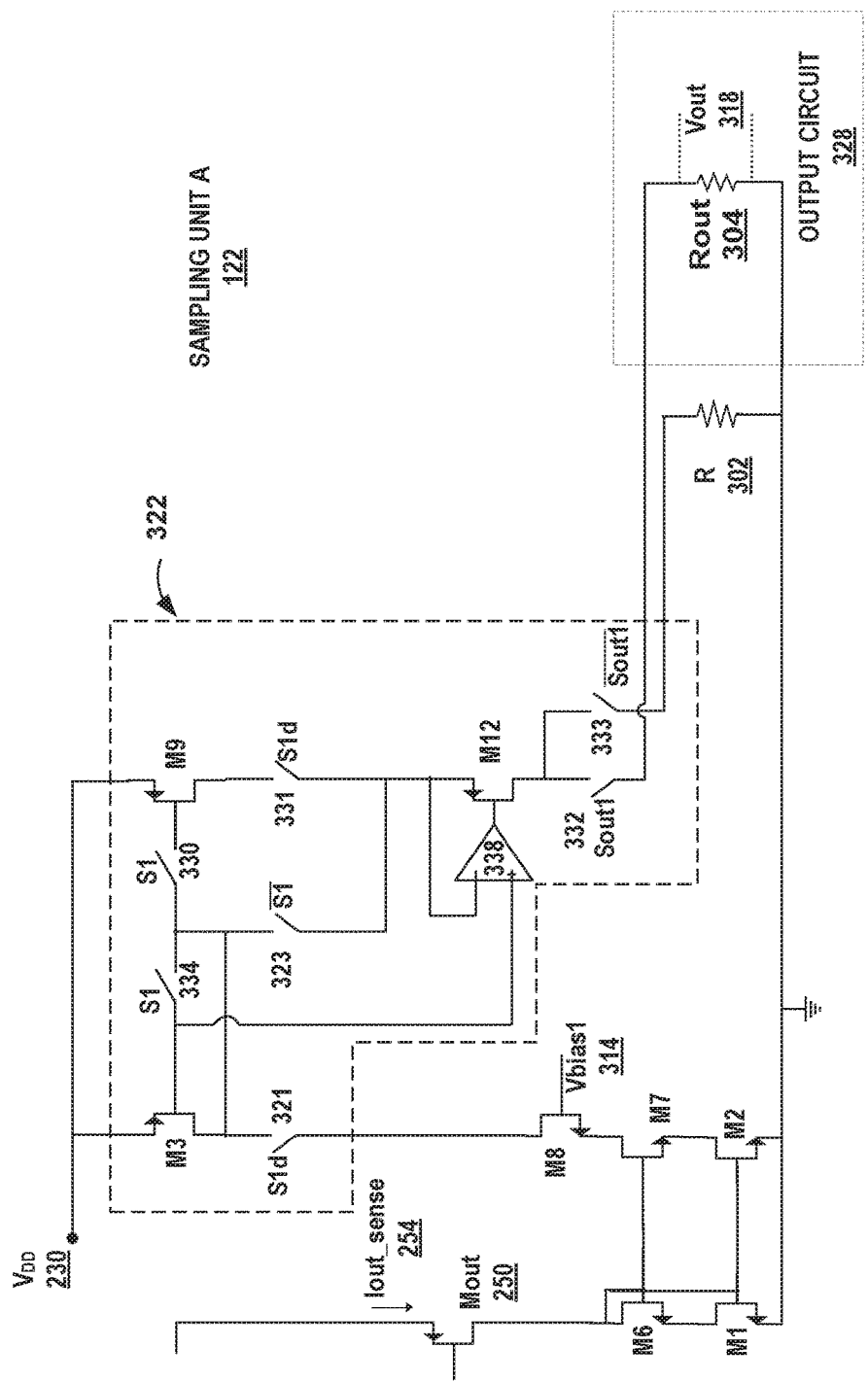
FIG. 3 is a schematic diagram illustrating an example implementation of a current sampling unit of this disclosure.

FIG. 3 is a schematic diagram illustrating an example implementation of a current sampling unit of this disclosure. Current sampling unit 322 may comprise one example implementation of current sampling unit A 122, current sampling unit B 124 and current sampling unit C 126 described above in relation to FIG. 1.

The input to example current sampling unit 322 includes an input current mirror including transistors M6, M1 M2 and M7. The input current mirror receives Iout-sense 254 from Mout 250. Iout-sense 254 from Mout 250 are the same as Iout-sense 254 and Mout 250 described above in relation to FIG. 2. The drain of Mout 250 connects to the drain of M6 as well as the gates of M6, M1, M2 and M7. The source of M6 connects to the drain of M1. The source of M1 connects to the source of M2 as well as to ground. The drain of M2 connects to the source of M7.

The drain of M7 connects to the source of M8. The gate of M8 is controlled by Vbias1 314. In some examples, transistors M6 and M7 may be selected to be low voltage devices with a different threshold voltage than other transistors in the circuit of sampling unit A 122. Thus, in some examples, transistors M6 and M7 may not be rated to withstand the full magnitude of the voltage at Vdd 230. The purpose of M8 is to provide a cascode configuration such that the drain-source voltage of, for example transistor M7, does not exceed a maximum rating for transistor M7. The magnitude of Vbias1 314 may be selected to tune the cascode configuration using M8 to allow the input current mirror to operate as described herein.

Current sampling unit 322 receives the mirrored input current based on Iout_sense 254 through switch 321. Switches 321 and 331 operate according to timing S1d. Current sampling unit 322 includes a current mirror of transistors M3 and M9. The sources of M3 and M9 connect to power supply Vdd 230. The gates of M3 and M9 connect to each other through switches 334 and 330. Switches 334 and 330 operating according to timing S1. The drain of M3 connects to the drain of M8 through switch 321. The drain of M3 also connects to the gate of M3 through switch 334, to the gate of M9 through switch 330 and the inverting input of amplifier 338 and the source of M12 through switch 323. Switch 323 operates according to timing $\overline{S1}$. In other words, switch 323 is closed when switches 334 and 330 are open and vice versa. The gate of M3 connects directly to the non-inverting input for amplifier 338. The drain of M9 connects to the source of M12 through switch 331. The gate of M12 is controlled by the output signal from amplifier 338. Switch 333 connects the drain of M12 to ground through resistor 302. Switch 332 connects the drain of M12 to ground through resistor Rout 304, which is part of output circuit 328. Switch 332 operates according to timing Sout1 and switch 333 operates according to timing $\overline{\text{Sout1}}$. In other words, when switch 332 is open, switch 333 is closed and vice versa. In some examples, a timing offset may be included for the switches in FIG. 3 to allow, for example switch 332 to open before switch 333 closes.

In operation, during a first phase, i.e. a sampling phase for current sampling unit 322, switches 321 and 331 are closed according to timing S1d, switches 334 and 330 are closed, according to timing S1, and switch 333 is closed according to timing $\overline{\text{Sout1}}$. Current sampling unit 322 may receive the mirrored current Iout_sense 254, e.g. from current sense unit 114, as described above in relation to FIGS. 1 and 2. Transistor M3 and transistor M9 mirror current Iout_sense 254 during the sampling phase. During the sampling phase, transistor M3 may operate in a diode configuration to read the input current Iout-sense 254.

At the end of the sampling phase, switches 321, 331, as well as switches 334 and 330 connecting the gates of transistors M3 and M9 may open and switch 323 may close. As described above, switch 323 closes approximately when switches 334 and 330 open.

During this second phase, or holding phase, switch 332 may close while switch 333 opens. The configuration of sampling unit 322 may cause a current to flow to Rout 304 that is approximately equal to the input current Iout-sense 254 that was sampled during the sampling phase. Amplifier 338 is configured as an error amplifier to keep the transistor diode of transistor M3 closed, by keeping $V_{ds}$ about equal to $V_{gs}$, for transistor M3, even when the $V_{gs}$ is sampled. In other words, the feedback loop that includes transistor M3 and amplifier 338 may keep transistor M3 in a diode configuration during the hold phase when switch 334 opens, similar to the configuration M3 is in during the sampling phase.

As described above in relation to FIG. 1, the sampling phase may be timed to coincide with a peak magnitude or a valley magnitude of Iout 134. Therefore, the sampling phase may be timed to coincide with a peak magnitude or a valley magnitude of Iout-sense 254, which may be a scaled and mirrored version of Iout 134. The timing of the sampling phase and the hold phase for each time period may be controlled by controller 112, described above in relation to FIG. 1, or some other portion of system 100 as depicted in FIG. 1 (not shown in FIG. 3).

Figure 4:
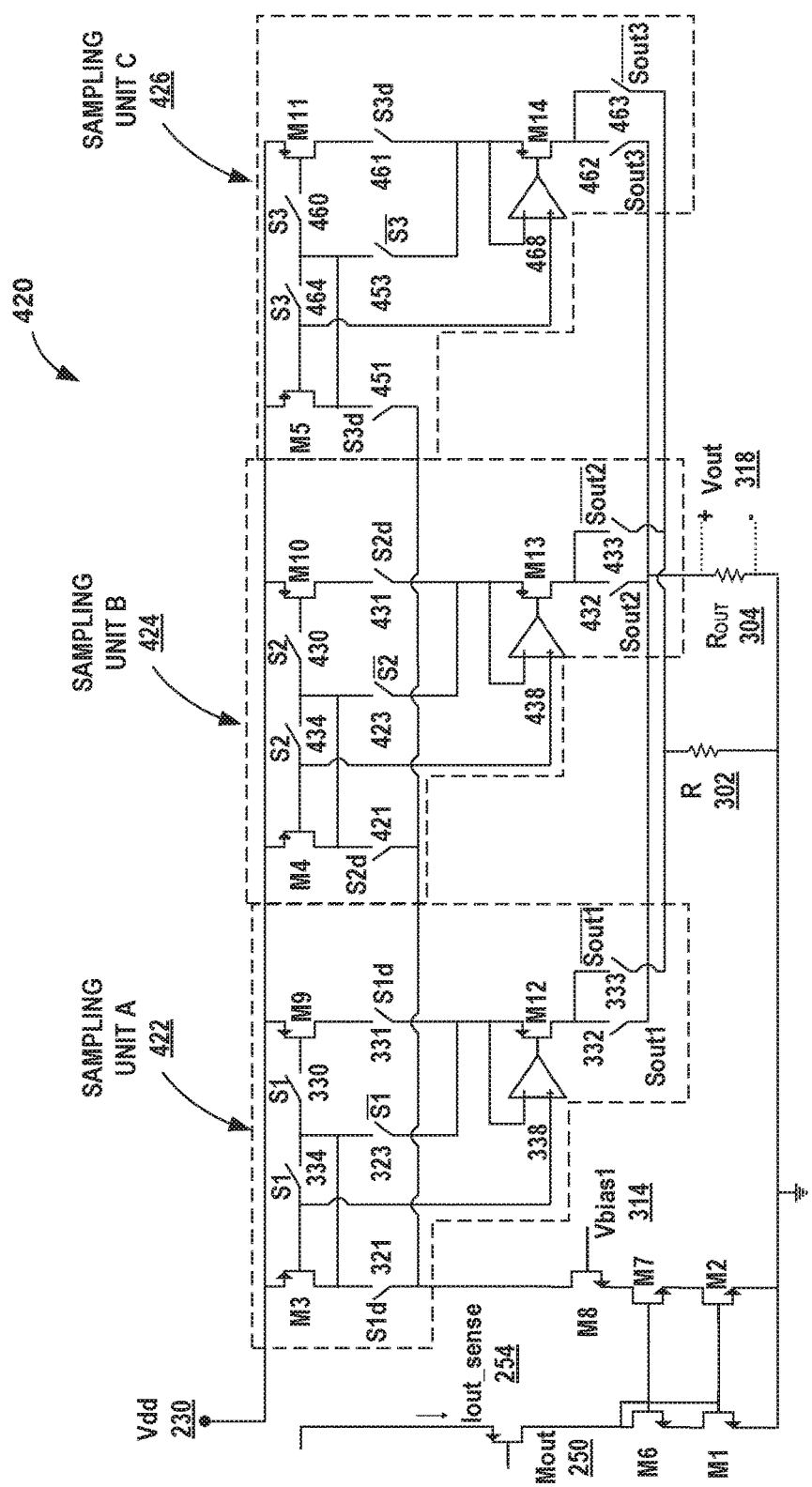
FIG. 4 is a schematic diagram illustrating an example implementation of an averaging unit of this disclosure.

FIG. 4 is a schematic diagram illustrating an example implementation of an averaging unit of this disclosure. Averaging unit 420 is a hardware circuit implementation example of averaging unit 120 described above in relation to FIG. 1. Elements of averaging unit 420 with the same reference numbers as in FIGS. 1-3 have the same description and function as described above in relation to FIGS. 1-3, e.g. Vdd 230, Mout 250, Iout-sense 254 and Vbias1 314.

As with averaging unit 120 depicted in FIG. 1, averaging unit 420 includes three sampling units, sampling unit A 422, sampling unit B 424 and sampling unit C 426. In operation, averaging unit 420 may be configured to receive the mirrored current Iout-sense 254 from Mout 250 as an input current to each sampling unit. Each sampling unit may receive the Iout-sense 254 according to the timing of S1d for sampling unit A 422 (switches 321 331), the timing of S2d for sampling unit B 424 (switches 421 and 431) and the timing of S3d for sampling unit C 426 (switches 451 and 461). In other words, averaging unit 420 may be configured to sample the input current Iout-sense 254 during the sampling phase of the time periods for each current sampling unit.

As described above in relation to FIG. 3, each sampling unit may be configurable to sample the input current Iout-sense 254 during the sampling phase. During the hold phase, each sampling unit may output the magnitude of the input current as measured during the sampling phase to the output circuit, i.e. resistor Rout 304. In other words, the time period for each sampling unit at least includes a sampling phase and a hold phase.

The timing of the sampling phase for a sampling unit, e.g. sampling unit A 422, may be set to capture either a relative peak magnitude of input current Iout-sense 254 or a relative valley magnitude of Iout-sense 254. The overall timing of the sampling units of averaging unit 420 may be set such that at any particular time a first sampling unit outputs the most recently measured peak magnitude of Iout-sense 254, a second sampling unit outputs the most recently measured valley amplitude of Iout-sense 254 and a third sampling unit is prepared to take the next sample of either a peak or a valley of Iout-sense 254. In other words, the sampling phase timing S1d, S2d and S3d, for any one sampling unit may not overlap the sampling phase timing for any other sampling unit. However, the hold phase timing for any two sampling units may overlap.

For example, at a selected point during a time period, sampling unit A 422, may output the most recent relative peak magnitude of Iout-sense 254, while sampling unit C 426, may output the most recent relative valley magnitude of Iout-sense 254. Averaging unit 420 may combine the signal from sampling unit A 422 and sampling unit C 426 to generate a signal based on the peak current and the valley current. In the example of averaging unit 420, the output signal from Rout 304 is a voltage signal Vout 318. In some examples, voltage signal Vout 318 may be proportional to an average magnitude of the peak magnitude and the valley magnitude of Iout-sense 254, and therefore, as described above, also the average magnitude of output current Iout 134.

During this same selected point in time, sampling unit B 424 may be preparing to sample Iout-sense 254, be sampling Iout-sense 254, or have just finished sampling Iout-sense 254. The timing of the remaining switches in sampling unit B 424, e.g. S2 (switches 434 and 430) and Sout2 (switches 432 and 433) may determine when sampling unit B 424 begins to output the sampled (peak or valley) magnitude to Rout 304. As sampling unit B 424 begins to output current to Rout 304, one of sampling unit A 422 or sampling unit C 426 may stop outputting current to Rout 304 and prepare to take the next sample of Iout-sense 254. In this manner, averaging unit 420 may continuously output the Vout 318 indicating the average magnitude of Iout 134. In some examples Vout 318 may be received by, for example controller 112 depicted in FIG. 1.

The average magnitude, which may also be referred to as the average amplitude of current in this disclosure, may be determined by exploiting the relationship:

$$I_{avg} = \frac{I_{peak} + I_{valley}}{2}$$

As described above in relation to FIG. 2, in some examples, current sense circuit 214 may be configured to take care of the division by two in the above relationship to calculate the average current. For example, one or both current mirrors in current sense circuit 214 may be configured such that the magnitude of Iout-sense 254 is half of the magnitude of the output current, e.g. Iout 134 described above in relation to FIG. 1. Therefore, the sampled current magnitude output from each sampling unit may be half the peak or valley magnitude of Iout 134 during the sampling period for a sampling unit. Thus, the sum of the output currents through Rout 304 may be equivalent to Iavg, shown in the relationship above.

The structure and function of each sampling unit depicted in averaging unit 420 may be similar to the structure and function of sampling unit 322, described above in relation to FIG. 3. For example, elements of sampling unit A 422 with the same reference numbers as in sampling unit 322 depicted in FIG. 3 have the same description and function.

Similarly, sampling unit B 424 receives Iout-sense 254 from the input mirror including transistors M6, M1 M2 and M7 and via transistor M8. Sampling unit B 424 receives the mirrored input current based on Iout_sense 254 through switch 421. Switches 421 and 431 operate according to timing S2d. Sampling unit B 424 includes a current mirror of transistors M4 and M10. The sources of M4 and M10 connect to power supply Vdd 230. The gates of M4 and M10 connect to each other through switches 434 and 430. Switches 434 and 430 operating according to timing S2. The drain of M4 connects to the drain of M8 through switch 421. The drain of M4 also connects to the gate of M4 through switch 434, to the gate of M10 through switch 430 and the inverting input of amplifier 438 and the source of M13 through switch 423. Switch 423 operates according to timing $\overline{S2}$. In other words, switch 423 is closed when switches 434 and 430 are open and vice versa. The gate of M4 connects directly to the non-inverting input for amplifier 438. The drain of M10 connects to the source of M13 through switch 431. The gate of M13 is controlled by the output signal from amplifier 438. Switch 433 connects the drain of M13 to ground through resistor 302. Switch 432 connects the drain of M13 to ground through resistor Rout 304, which is part of the output circuit of averaging unit 420. Switch 432 operates according to timing Sout2 and switch 433 operates according to timing $\overline{Sout2}$. In other words, when switch 432 is open, switch 433 is closed and vice versa. Amplifier 338 is configured as an error amplifier to keep the transistor diode of transistor M4 closed, by keeping $V_{ds}$ about equal to $V_{gs}$.

Sampling unit C 426 also receives Iout-sense 254 from the input mirror including transistors M6, M1 M2 and M7 and via transistor M8. Sampling unit C 426 receives the mirrored input current based on Iout_sense 254 through switch 451. Switches 451 and 461 operate according to timing S3d. Sampling unit B 424 includes a current mirror of transistors M5 and M11. The sources of M5 and M11 connect to power supply Vdd 230. The gates of M5 and M11 connect to each other through switches 464 and 460. Switches 464 and 460 operating according to timing S3. The drain of M5 connects to the drain of M8 through switch 451. The drain of M5 also connects to the gate of M5 through switch 464, to the gate of M11 through switch 460 and the inverting input of amplifier 468 and the source of M14 through switch 453. Switch 453 operates according to timing $\overline{S2}$. In other words, switch 453 is closed when switches 464 and 460 are open and vice versa. The gate of M5 connects directly to the non-inverting input for amplifier 468. The drain of M11 connects to the source of M14 through switch 461. The gate of M14 is controlled by the output signal from amplifier 468. Switch 463 connects the drain of M14 to ground through resistor 302. Switch 462 connects the drain of M14 to ground through resistor Rout 304, which is part of the output circuit of averaging unit 420. Switch 462 operates according to timing Sout3 and switch 463 operates according to timing $\overline{Sout2}$. In other words, when switch 462 is open, switch 463 is closed and vice versa. Amplifier 338 is configured as an error amplifier to keep the transistor diode of transistor M5 closed, by keeping $V_{ds}$ about equal to $V_{gs}$.

As described above in relation to FIG. 2, the techniques presented in this disclosure may be advantageous relative to other techniques to estimate the average current delivered by a power converter, e.g. a buck converter in CCM. Some advantages may include the elimination of dedicated pins.

For example, an averaging unit, such as averaging unit 420 implemented on a controller IC for a power converter may not require any additional pins to measure power converter output current for the controller IC. The techniques of this disclosure further do not require precise knowledge of the inductance or resistance values of the high side or low side switches, may sample a load current that varies from low to high magnitude and consumes little power, without losing accuracy.

An additional advantage of averaging unit 420 is that averaging unit 420 performs scrambling between the different sampling units and therefore, between the value that each sampling single samples. That is, each sampling unit may sample the peak value and valley value and alternating between sampling the peak value and valley value. This scrambling helps to average out any error caused by mismatch between the sampling units. Mismatch may be caused by process variation during manufacturing, for example.

At a system level, a current monitoring circuit implemented using an averaging unit, such as averaging unit 420, may add another functionality to a switching power converter, such as buck power converter circuit 136, described above in relation to FIG. 1. These additional functions may otherwise have to be implemented external to the power converter. For example, the signal, e.g. Vout 318, could be used as a further monitoring of the operation of the power converter. This system could also help in an analysis of power consumption in applications, such as battery powered vehicles, in which energy savings are considered particularly important. These additional functions may also be useful in detecting possible malfunctions of devices supplied by the power converter, should any anomalies arise in the current supplied.

Figure 5:
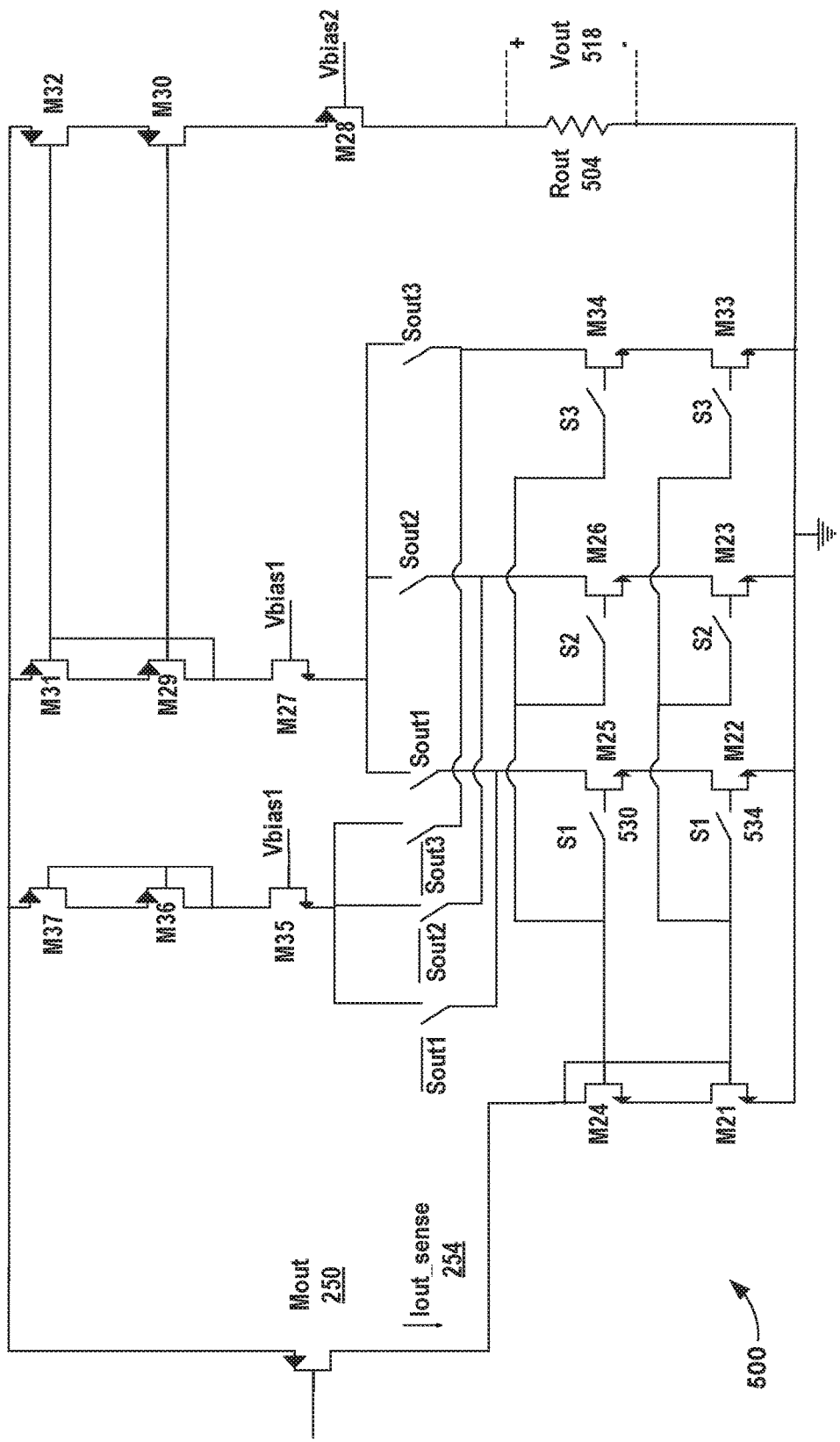
FIG. 5 is a schematic diagram illustrating and example implementation of a sampling current mirror circuit implemented with NMOS transistors according to one or more techniques of this disclosure.

FIG. 5 is a schematic diagram illustrating and example implementation of a sampling current mirror circuit implemented with NMOS transistors according to one or more techniques of this disclosure. Sampling circuit 500 is an example of a sampling circuit that may be used in conjunction with averaging unit 120 and averaging unit 420 described above in relation to FIGS. 1 and 4. Timing signals and other elements depicted in FIG. 5 that are the same as those depicted, for example in FIGS. 3 and 4 have the same function and description as in FIGS. 3 and 4, such as Iout-sense 254, S1, S2, Sout2 and $\overline{Sout2}$.

In the example of circuit 500, the N-MOS devices. M22-M25, M23-M26 and M33-M34 are sampling elements. With the switch above each sampling element, the circuit sets at what timing to sample the input current Iout-sense 254. For example, switches 530 and 534 may close according to timing S1 to sample Iout-sense 254 via sampling elements M22-M25. The switch timing for S2 and S3 operate in a similar manner.

In circuit 500, a single switch could have been used to control the timing of S1, S2 or S3. For example, switches 530 and 534 could have been combined into a single switch. However, transistors M25, M26 and M34 have a separate switch from transistors M22, M23 and M33 to reduce the variation of gate voltage to M25, M26 and M34 which may be caused by $V_{DS}$ variation in the transistors. The different working phase are identical to that described above in relation to FIG. 4.

Figure 6A:
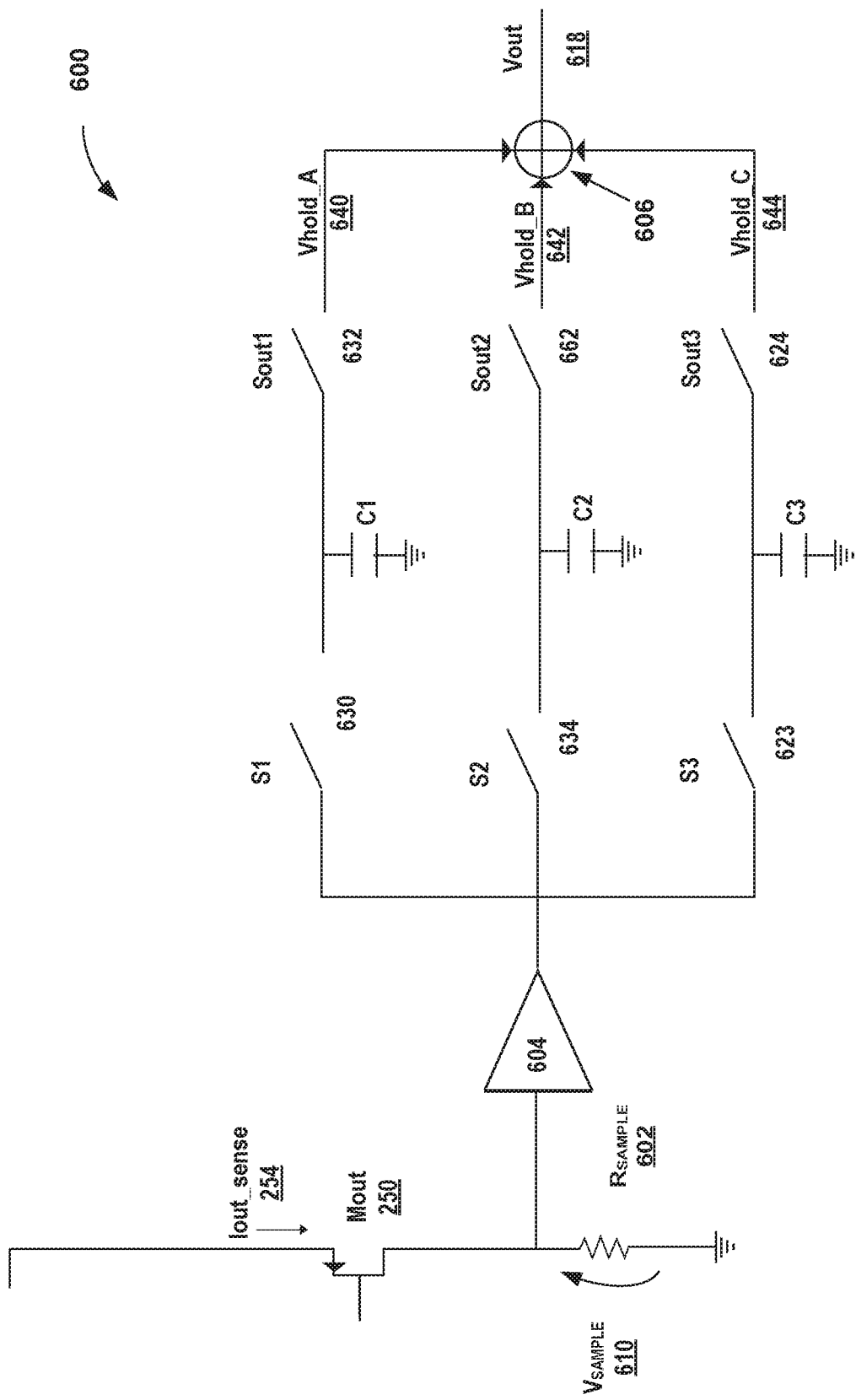
FIG. 6A is a schematic diagram illustrating an example sampling circuit for sampling a voltage rather than sampling a current, according to one or more techniques of this disclosure.

FIG. 6A is a schematic diagram illustrating an example sampling circuit for sampling a voltage rather than sampling a current, according to one or more techniques of this disclosure. Circuit 600 may be considered an alternative to averaging unit 420 or averaging unit 120 described above in relation to FIGS. 4 and 1.

Circuit 600 includes a summing node 606 that may output a voltage signal Vout 618 that is an indicator of the average magnitude of output current Iout 134, as described above in relation to FIG. 1. Circuit 600 receives input current Iout_sense 254 via Mout 250 as described above in relation to FIGS. 2-4. As described above in relation to FIG. 2, Iout-sense 254 may be a scaled mirror of Iout 134, for example, with a magnitude of half of Iout 134, to take care of the division by two used to determine the average between the peak and the valley magnitudes. In other examples, the value of Rsample 602 may be selected to scale sample voltage Vsample 610, such that the voltage to buffer 604 is an indication of half the magnitude of Iout 134.

In the example of circuit 600, the output of buffer 604 connects to switches 630, 634 and 623. Switch 630 connects buffer 604 to capacitor C1. Switch 632 connects capacitor C1 to summing node 606. Similarly, switch 634 connects buffer 604 to capacitor C2. Switch 662 connects capacitor C2 to summing node 606. Also, switch 623 connects buffer 604 to capacitor C3. Switch 624 connects capacitor C3 to summing node 606. Summing node 606 may also be referred to as a summing junction.

In operation, during a sampling phase, for example switch 630 may close according to timing S1, which is similar to timing S1 described above in relation to FIGS. 3 and 4. Timing S1 may be set to sample the output of buffer 604 at either a peak magnitude or valley magnitude, as described above in relation to FIGS. 1-3. During the sampling phase, closing switch 630 may cause buffer 604 to charge capacitor C1 to the voltage magnitude output from buffer 604 at the time of sampling. During a hold phase, switch 630 may open and switch 632 may close, according to timing Sout1. Closing switch 632 causes the voltage stored on capacitor C1, i.e. Vhold_A 640, to connect to summing node 606 and to be output to Vout 618.

The sampling for the branch including switch 634, capacitor C2 and switch 662, as well as the branch including switch 623, capacitor C3 and switch 624 may operate in a similar manner. During any selected time, one branch capacitor may hold and output a peak magnitude, e.g. Vhold_B 642 while a second branch capacitor holds and outputs a valley magnitude, e.g. Vhold_C 644. Summing node 606 may add the peak magnitude to the valley magnitude and output a signal indicating the average magnitude to Vout 618. The remaining branch capacitor may be preparing to sample the voltage from buffer 604, be in the process of sampling the voltage or have completed sampling the voltage. In this manner, circuit 600 may continuously output a signal indicating the average magnitude of output current Iout 134, similar to averaging unit 420 described above in relation to FIG. 4.

Circuit 600 may have several advantages, when compared to other types of sampling configurations. For example, circuit 600 performs scrambling of sampling the peak and valley values among the different branches of circuit 600. Therefore, similar to the scrambling described above in relation to FIG. 4, rotating or scrambling the measurements among the different branches may average out any mismatches caused by process variation. Circuit 600 may have some disadvantages when compared to averaging circuit 420 described above in relation to FIG. 4. Circuit 600 may be difficult to implement because to avoid channel modulation in transistor Mout 250, Rsample 602 should be a relatively low value to keep the drain bias for Mout 250 low. A small value of Rsample 602 may result in relatively low values for Vsample 610, thereby causing a relatively low input offset for buffer 604.

Figure 6B:
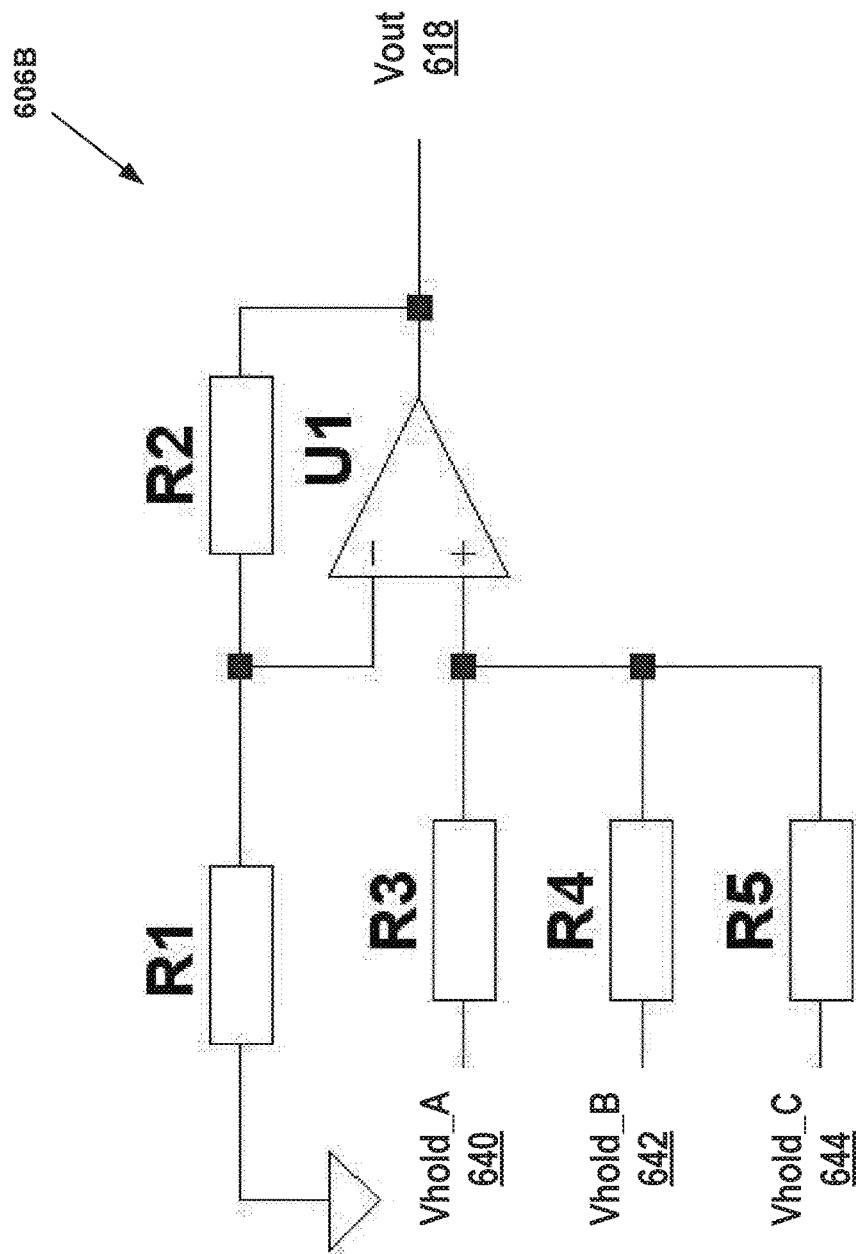
FIG. 6B is a schematic diagram illustrating an example implementation of the summing junction depicted in FIG. 6A.

FIG. 6B is a schematic diagram illustrating an example implementation of the summing junction depicted in FIG. 6A. In some examples, summing node 606, described above in relation to FIG. 6A may be implemented using an operational amplifier configured in non-inverting summing stage with buffered inputs as shown in summing node 606B.

Example summing node 606B includes op-amp U1 with resistor R2 connected between the output of op-amp U1 and the inverting input of op-amp U1. Resistor R1 connects the inverting input to ground. Hold voltages Vhold_A 640, Vhold_B 642 and Vhold_C 644, are the same as described above in relation to FIG. 6A.

Vhold_A 640 connects to the non-inverting input of op-amp U1 through resistor R3. Similarly, Vhold_B 642 connects to the non-inverting input of op-amp U1 through resistor R4. Also, Vhold_C 644 connects to the non-inverting input of op-amp U1 through resistor R5.

Figure 7A:
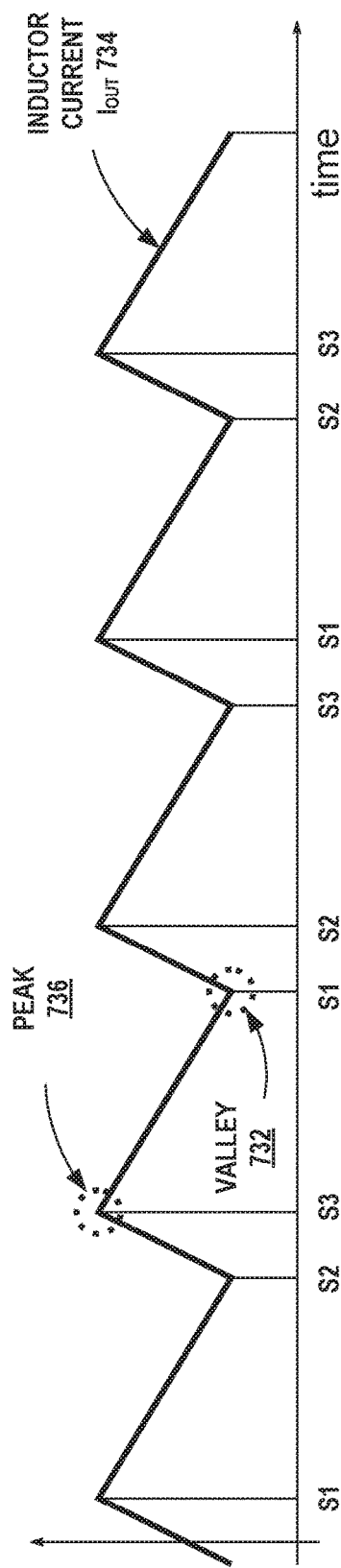
FIG. 7A is a time graph illustrating an example output current from a buck power converter circuit operating in CCM of this disclosure.

FIG. 7A is a time graph illustrating an example output current from a buck power converter circuit operating in CCM of this disclosure. The current through inductor L 106 is sent to the output Vout 132 as output current Iout 134, as described above in relation to FIG. 1. Inductor current Iout 734 in FIG. 7A depicts an example of how the output current, such as Iout 134, may have a peak magnitude, e.g. at peak 736, and a valley magnitude, e.g. at valley 732. The time graph of Iout 734 may also represent an example of the time varying properties of input current Iout-sense 254 described above in relation to FIGS. 2-5.

In the example of FIG. 7A, the peak magnitudes of inductor current Iout 734 may be approximately equal to each other. Similarly, the valley magnitudes are approximately equal. Examples of the sampling phase for each sampling unit, as described above in relation to FIGS. 4 and 6A, are depicted as a repeating sequence of S1, S2 and S3. As described above, at any one time the most recent peak magnitude and valley magnitude may be combined to output a signal indicating an average magnitude for Iout 734. The signal may take advantage of the below relationship, as described above in relation to FIG. 3.

$$I_{avg} = \frac{I_{peak} + I_{valley}}{2}$$

Figure 7B:
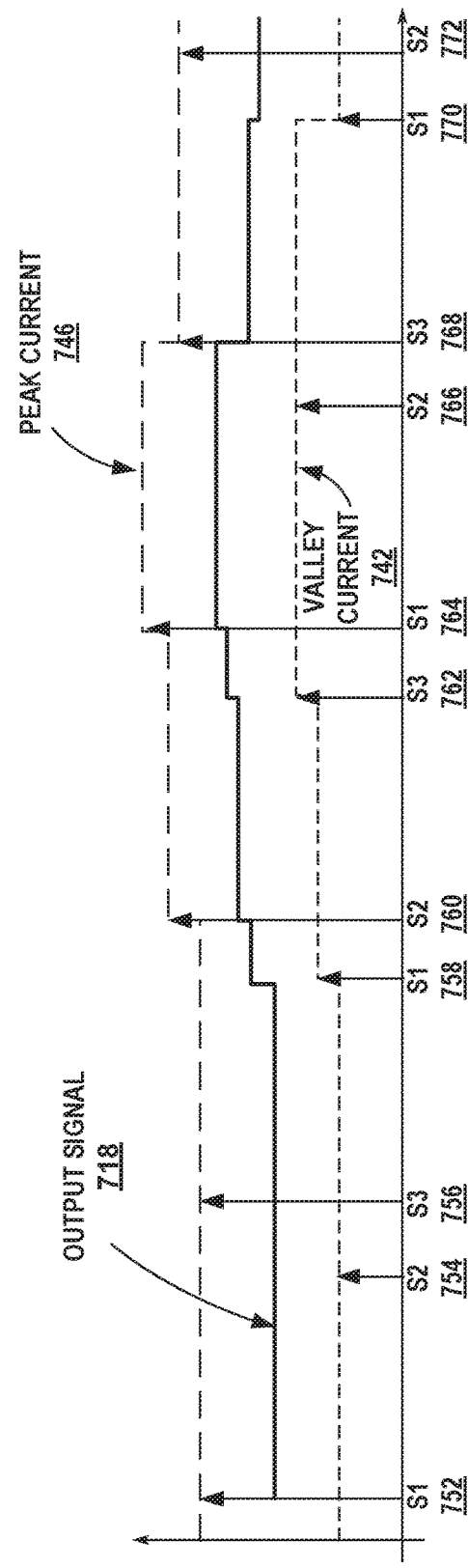
FIG. 7B is a time graph illustrating an example of how the output signal indicating the average output current may vary as the peak and valley current varies.

FIG. 7B is a time graph illustrating an example of how the output signal indicating the average output current may vary as the peak and valley current varies. In contrast to the time graph of FIG. 7A, the time graph of FIG. 7B is based on an example output current from a power converter that is changing over time.

Valley current 742, e.g. as sampled at valley 732 depicted in FIG. 7A, stays approximately constant through S2 754. At S1 758, e.g. as sampled by sample unit A 422 during timing S1, valley current 742 increases compared to the previous samples. At S3 762, e.g. as sampled by sample unit C 426 during timing S3, valley current 742 increases again. At S1 770, valley current 742 decreases.

Peak current 746, e.g. as sampled at peak 736 depicted in FIG. 7A, stays approximately constant through S1 752 and S3 756. At S2 760, e.g. as sampled by sample unit B 424 during timing S2, peak current 746 increases compared to the previous samples. At S1 764, e.g. as sampled by sample unit A 422 during timing S1, peak current 746 increases again. At S3 768, peak current 746 decreases.

Output signal 718 may be a signal output from output circuit 128 of current monitoring circuit 140, as described above in relation to FIG. 1. The magnitude of output signal 718 may indicate the magnitude of the average output current of the power converter, e.g. Iout 134 described above in relation to FIG. 1 and Iout 734 described in FIG. 7A. As described above in relation to FIGS. 1, 4 and 6, output signal 718 is based on the most recently sampled peak magnitude and valley magnitude of the output current, e.g. Iout 134. Output signal 718 may be either a voltage signal or a current signal.

Output signal 718 remains approximately constant through S1 758. As the sampled valley current 742 increases at S1 758, this valley is combined with the sampled peak current at S3 756 to result in an increase in output signal 718. As peak current 746 increases at S2 760, the new sampled peak magnitude from S2 760 is combined with the valley magnitude sampled at S1 758 to result in another increase in output signal 718. In other words, because both the most recent peak and valley magnitudes increased, the output signal 718 increased, thereby indicating an increase in the average output current from the power converter.

Output signal 718 continues to react to changes in the sampled peak current 746 and valley current 742 through the remainder of the time graph of FIG. 7B. For example, the decrease in peak current 746 at S3 768 combines with the sampled valley current at S2 766 to result in a decrease in output signal 718 at S3 768. In this manner the magnitude of output signal 718 may indicate the magnitude of the average output current of the power converter.

Figure 8:
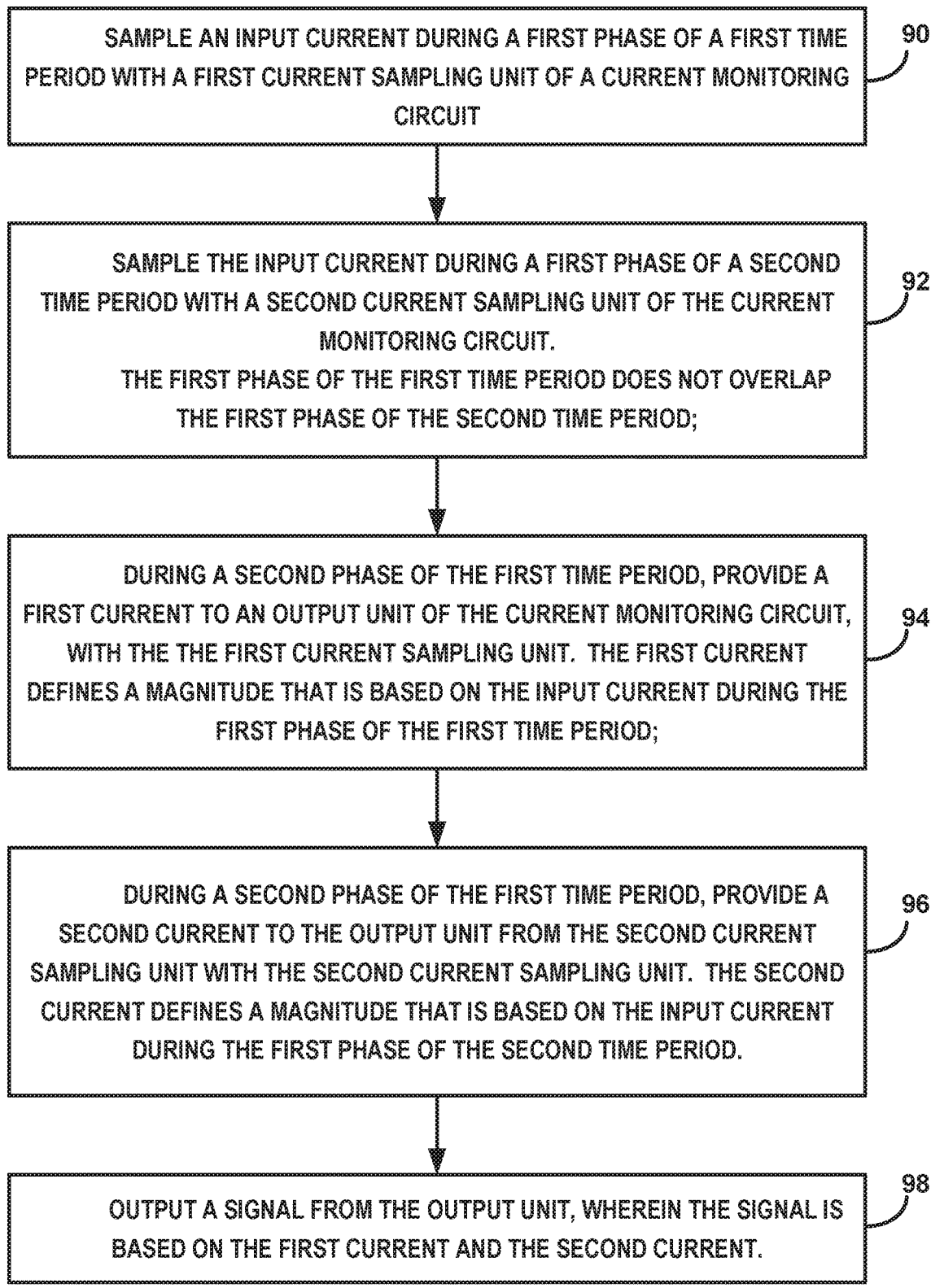
FIG. 8. is a flow diagram illustrating an example operation of the output current monitoring circuit of this disclosure.

FIG. 8. is a flow diagram illustrating an example operation of the output current monitoring circuit according to one or more techniques of this disclosure. The blocks of FIG. 8 will be described in terms of FIGS. 1, 7A and 7B unless otherwise noted.

Sampling unit A 122 of current monitoring circuit 140, may sample an input current, e.g. Iout-sense 254 depicted in FIG. 2, during a sampling phase of a first time period (90). Iout-sense 254 may be a mirror of Iout 134. In some examples, Iout-sense 254 may be a scaled mirror of Iout 134 such that the scaling of Iout-sense 254 may take care of the division by two used to determine the average magnitude of Iout 134.

Sampling unit B 424 of current monitoring circuit 140 may sample the input current during a sampling phase of a second time period (92). The sampling phase of the first time period does not overlap the sampling phase of the second time period. For example, the first sampling period, e.g. of sampling unit A 422 may sample the peak magnitude of Iout 134, e.g. at peak 736 depicted in FIG. 7A. The second sampling period, e.g. of sampling unit B 424 may sample the valley magnitude of Iout 134, e.g. at valley 732 depicted in FIG. 7A.

During a second phase, or hold phase, of the first time period, the first current sampling unit may provide a first current to an output unit, e.g. output circuit 128 of current monitoring circuit 140 (94). The first current may define a magnitude that is based on the input current during the sampling phase of the first time period. For example, from S1 752 until S3 756, sampling unit A 122, may output a current 746, that defines the peak magnitude based on input current Iout-sense 254, during the sampling phase of the first time period. As shown in FIG. 7B, the hold phase of sampling unit A 122 may overlap with the hold phases of sampling unit B 124 and sampling unit C 126, but the sampling phases do not overlap.

During a second phase of the second time period, the second current sampling unit may provide a second current to the output unit from the second current sampling unit (96). The second current may define a magnitude that is based on the input current during the first phase of the second time period. As one example, from S2 754 until S1 758, sampling unit B 124 may output a current that defines the magnitude based on the valley current of Iout 734 depicted in FIG. 7A.

Current monitoring circuit 140 may output a signal from output unit 128. The signal may be based on the first current and the second current. For example, as described above in relation to FIG. 4, the combined current from any two sampling units through Rout 304 may output a voltage signal Vout 318 based on the superposition of the two currents. In other examples the output signal from output unit 128 may be a current signal instead of a voltage signal. By reconfiguring the output circuit, e.g. including a source follower circuit, or simply outputting the combined sampled currents, the output signal may be a current signal.

The techniques of this disclosure may also be described in the following examples.

Example 1. A circuit comprising a first current sampling unit, a second current sampling unit, and an output unit, the circuit configured to: sample an input current during a first phase of a first time period with the first current sampling unit, sample the input current during a first phase of a second time period with the second current sampling unit, wherein the first phase of the first time period does not overlap the first phase of the second time period. During a second phase of the first time period, provide a first current to the output unit from the first current sampling unit, wherein the first current defines a magnitude that is based on the input current during the first phase of the first time period. During a second phase of the second time period, provide a second current to the output unit from the second current sampling unit, wherein the second current defines a magnitude that is based on the input current during the first phase of the second time period and output a signal from the output unit, wherein the signal is based on the first current and the second current.

Example 2. The circuit of example 1, wherein the signal from the output unit is proportional to the average of: the magnitude of the input current of the first sampling block and a magnitude of the input current of the second sampling block.

Example 3. The circuit of any of examples 1-2 or any combination thereof, wherein the signal comprises a voltage.

Example 4. The circuit of any combination of examples 1-3, wherein the signal comprises a current.

Example 5. The circuit of any combination of examples 1-4, wherein the magnitude of the input current comprises a periodic signal, wherein each period of the periodic signal comprises a current peak and a current valley.

Example 6. The circuit of any combination of examples 1-5, further comprising a third current sampling unit, the circuit further configured to: sample the input current during a first phase of a third time period with the third current sampling unit, wherein the first phase of the third time period does not overlap the first phase of the first time period nor the first phase of the second time period, wherein during the first phase of the third time period: the first current sampling unit provides the first current to the output unit, wherein the magnitude of the first current defines the current peak, and the second current sampling unit provides the second current to the output unit wherein the magnitude of the second current defines the current valley.

Example 7. The circuit of any combination of examples 1-6, wherein the output unit is configured to continuously output the signal, and wherein the signal from the output unit is proportional to the average of the magnitude of the input current.

Example 8. The circuit of any combination of examples 1-7, wherein the first current sampling unit, the second current sampling unit and the third current sampling unit each comprise: a current mirror including a first transistor and a second transistor, the current mirror configured to: sample an input current during the first phase; copy a magnitude of the input current during the first phase, output from the first transistor a current comprising the magnitude of the input current during the second phase, and an error amplifier configured to keep the drain-source voltage of the first transistor approximately equal to the gate-source voltage of the first transistor during the second phase.

Example 9. A method comprising: sampling, with a first current sampling unit of a current monitoring circuit, an input current during a first phase of a first time period, sampling, with a second current sampling unit of the current monitoring circuit, the input current during a first phase of a second time period, wherein the first phase of the first time period does not overlap the first phase of the second time period. During a second phase of the first time period, providing, by the first current sampling unit, a first current to an output unit of the current monitoring circuit, wherein the first current defines a magnitude that is based on the input current during the first phase of the first time period. During a second phase of the second time period, providing, by the second current sampling unit, a second current to the output unit from the second current sampling unit, wherein the second current defines a magnitude that is based on the input current during the first phase of the second time period, and outputting a signal from the output unit, wherein the signal is based on the first current and the second current.

Example 10. The method of example 9, wherein the signal from the output unit is proportional to the average of: the magnitude of the input current of the first sampling unit and a magnitude of the input current of the second sampling unit.

Example 11. The method of any combination of examples 9-10, wherein the magnitude of the input current comprises a periodic signal, wherein each period of the periodic signal comprises a current peak and a current valley.

Example 12. The method of any combination of examples 9-10, further comprising: sampling, by a third current sampling unit of the current monitoring circuit, the input current during a first phase of a third time period with the third current sampling unit, wherein the first phase of the third time period does not overlap the first phase of the first time period nor the first phase of the second time period, wherein during the first phase of the third time period: providing, by the first current sampling unit the first current to the output unit, wherein the magnitude of the first current comprises the current peak, and providing, by the second current sampling unit, the second current to the output unit wherein the magnitude of the second current comprises the current valley.

Example 13. The method of any combination of examples 9-10, wherein the first current sampling unit, the second current sampling unit and the third current sampling unit each comprise: a current mirror comprising a first transistor and a second transistor, the current mirror configured to: sample an input current during the first phase, copy a magnitude of the input current during the first phase, output from the first transistor a current comprising the magnitude of the input current during the second phase, and an error amplifier configured to keep the drain-source voltage of the first transistor approximately equal to the gate-source voltage of the first transistor during the second phase.

Example 14. A system comprising: a power converter circuit, a current monitoring circuit comprising: a current sense unit configured to mirror the output current of the power converter circuit, and an averaging unit comprising a first current sampling unit, a second current sampling unit, and an output unit. The circuit may be configured to: receive the mirrored current from the current sense unit as an input current, sample the input current during a first phase of a first time period with the first current sampling unit, sample the input current during a first phase of a second time period with the second current sampling unit, wherein the first phase of the first time period does not overlap the first phase of the second time period. During a second phase of the first time period, provide a first current to the output unit from the first current sampling unit, wherein the first current defines a magnitude that is based on the input current during the first phase of the first time period. During a second phase of the second time period, provide a second current to the output unit from the second current sampling unit, wherein the second current defines a magnitude that is based on the input current during the first phase of the second time period and output a signal from the output unit, wherein the signal is based on the first current and the second current.

Example 15. The system of example 15, wherein the signal from the output unit is proportional to the average of: the magnitude of the input current of the first sampling block and a magnitude of the input current of the second sampling block.

Example 16. The system of any combination of examples 15-16, wherein a power converter circuit, a current monitoring circuit comprising: a current sense unit configured to mirror the output current of the power converter circuit, and an averaging unit comprising a first current sampling unit, a second current sampling unit, and an output unit, the circuit configured to: receive the mirrored current from the current sense unit as an input current, sample the input current during a first phase of a first time period with the first current sampling unit, sample the input current during a first phase of a second time period with the second current sampling unit, wherein the first phase of the first time period does not overlap the first phase of the second time period, during a second phase of the first time period, provide a first current to the output unit from the first current sampling unit, wherein the first current defines a magnitude that is based on the input current during the first phase of the first time period, during a second phase of the second time period, provide a second current to the output unit from the second current sampling unit, wherein the second current defines a magnitude that is based on the input current during the first phase of the second time period, and output a signal from the output unit, wherein the signal is based on the first current and the second current.

Example 17. The system of any combination of examples 15-16, further comprising a third current sampling unit, the circuit further configured to: sample the input current during a first phase of a third time period with the third current sampling unit, wherein the first phase of the third time period does not overlap the first phase of the first time period nor the first phase of the second time period, wherein during the first phase of the third time period: the first current sampling unit provides the first current to the output unit, wherein the magnitude of the first current defines the current peak, and the second current sampling unit provides the second current to the output unit wherein the magnitude of the second current defines the current valley.

Example 18. The system of any combination of examples 15-16, wherein the output unit is configured to continuously output the signal, and wherein the signal from the output unit is proportional to the average of the magnitude of the input current.

Example 19. The system of any combination of examples 15-16, wherein the first current sampling unit, the second current sampling unit and the third current sampling unit each comprise: a current mirror comprising a first transistor and a second transistor, the current mirror configured to: sample an input current during the first phase, copy a magnitude of the input current during the first phase, output from the first transistor a current comprising the magnitude of the input current during the second phase, and an error amplifier configured to keep the drain-source voltage of the first transistor approximately equal to the gate-source voltage of the first transistor during the second phase.

Example 20. The system of any combination of examples 15-16, wherein the power converter is a buck power converter.

Various examples of the disclosure have been described. These and other examples are within the scope of the following claims.

The invention claimed is:

1. A circuit comprising a first current sampling unit, a second current sampling unit, and an output unit, the circuit configured to:
    sample an input current during a first phase of a first time period with the first current sampling unit;
    sample the input current during a first phase of a second time period with the second current sampling unit, wherein the first phase of the first time period does not overlap the first phase of the second time period;
    during a second phase of the first time period, provide a first current to the output unit from the first current sampling unit, wherein the first current defines a magnitude that is based on the input current during the first phase of the first time period;
    during a second phase of the second time period, provide a second current to the output unit from the second current sampling unit, wherein the second current defines a magnitude that is based on the input current during the first phase of the second time period; and
    output a signal from the output unit, wherein the signal is based on the first current and the second current.

2. The circuit of claim 1, wherein the signal from the output unit is proportional to an average of:
    the magnitude of the input current as sampled by the first sampling unit; and
    the magnitude of the input current as sampled by the second sampling unit.

3. The circuit of claim 2, wherein the signal comprises a voltage.

4. The circuit of claim 2, wherein the signal comprises a current.

5. The circuit of claim 1, wherein the magnitude of the input current comprises a periodic signal, wherein each period of the periodic signal comprises a current peak and a current valley.

6. The circuit of claim 5, further comprising a third current sampling unit, the circuit further configured to:
    sample the input current during a first phase of a third time period with the third current sampling unit,
        wherein the first phase of the third time period does not overlap the first phase of the first time period nor the first phase of the second time period,
        wherein during the first phase of the third time period:

the first current sampling unit provides the first current to the output unit, wherein the magnitude of the first current defines the current peak, and the second current sampling unit provides the second current to the output unit wherein the magnitude of the second current defines the current valley.

7. The circuit of claim 6, wherein the output unit is configured to continuously output the signal, and wherein the signal from the output unit is proportional to an average of the magnitude of the input current.

8. The circuit of claim 6, wherein the first current sampling unit, the second current sampling unit and the third current sampling unit each comprise:

a current mirror including a first transistor and a second transistor, the current mirror configured to:

sample an input current during the first phase;

copy a magnitude of the input current during the first phase;

output from the first transistor a current comprising the magnitude of the input current during the second phase; and an error amplifier configured to keep a drain-source voltage of the first transistor approximately equal to a gate-source voltage of the first transistor during the second phase.

9. A method comprising:

sampling, with a first current sampling unit of a current monitoring circuit, an input current during a first phase of a first time period;

sampling, with a second current sampling unit of the current monitoring circuit, the input current during a first phase of a second time period, wherein the first phase of the first time period does not overlap the first phase of the second time period;

during a second phase of the first time period, providing, by the first current sampling unit, a first current to an output unit of the current monitoring circuit, wherein the first current defines a magnitude that is based on the input current during the first phase of the first time period;

during a second phase of the second time period, providing, by the second current sampling unit, a second current to the output unit from the second current sampling unit, wherein the second current defines a magnitude that is based on the input current during the first phase of the second time period; and outputting a signal from the output unit, wherein the signal is based on the first current and the second current.

10. The method of claim 9, wherein the signal from the output unit is proportional to an average of:

the magnitude of the input current as sampled by the first sampling unit; and the magnitude of the input current as sampled by the second sampling unit.

11. The method of claim 9, wherein the magnitude of the input current comprises a periodic signal, wherein each period of the periodic signal comprises a current peak and a current valley.

12. The method of claim 11, further comprising:

sampling, by a third current sampling unit of the current monitoring circuit, the input current during a first phase of a third time period with the third current sampling unit, wherein the first phase of the third time period does not overlap the first phase of the first time period nor the first phase of the second time period, wherein during the first phase of the third time period:

providing, by the first current sampling unit the first current to the output unit, wherein the magnitude of the first current comprises the current peak, and providing, by the second current sampling unit, the second current to the output unit wherein the magnitude of the second current comprises the current valley.

13. The method of claim 12, wherein the first current sampling unit, the second current sampling unit and the third current sampling unit each comprise:

a current mirror comprising a first transistor and a second transistor, the current mirror configured to:

sample an input current during the first phase;

copy a magnitude of the input current during the first phase;

output from the first transistor a current comprising the magnitude of the input current during the second phase; and an error amplifier configured to keep a drain-source voltage of the first transistor approximately equal to the gate-source voltage of a first transistor during the second phase.

14. A system comprising:

a power converter circuit;

a current monitoring circuit comprising:

a current sense unit configured to mirror an output current of the power converter circuit; and an averaging unit comprising a first current sampling unit, a second current sampling unit, and an output unit, the averaging unit configured to:

receive the mirrored current from the current sense unit as an input current;

sample the input current during a first phase of a first time period with the first current sampling unit;

sample the input current during a first phase of a second time period with the second current sampling unit, wherein the first phase of the first time period does not overlap the first phase of the second time period;

during a second phase of the first time period, provide a first current to the output unit from the first current sampling unit, wherein the first current defines a magnitude that is based on the input current during the first phase of the first time period;

during a second phase of the second time period, provide a second current to the output unit from the second current sampling unit, wherein the second current defines a magnitude that is based on the input current during the first phase of the second time period; and output a signal from the output unit, wherein the signal is based on the first current and the second current.

15. The system of claim 14, wherein the signal from the output unit is proportional to an average of:

a magnitude of the input current as sampled at the first sampling unit; and the magnitude of the input current as sampled at the second sampling unit.

16. The system of claim 14, wherein the magnitude of the input current is a periodic signal, wherein each period of the periodic signal comprises a current peak and a current valley.

17. The system of claim 16, further comprising a third current sampling unit, the circuit further configured to:
   sample the input current during a first phase of a third time period with the third current sampling unit,
      wherein the first phase of the third time period does not overlap the first phase of the first time period nor the first phase of the second time period,
      wherein during the first phase of the third time period:
         the first current sampling unit provides the first current to the output unit, wherein the magnitude of the first current defines the current peak, and
         the second current sampling unit provides the second current to the output unit wherein the magnitude of the second current defines the current valley.

18. The system of claim 17,
   wherein the output unit is configured to continuously output the signal, and
   wherein the signal from the output unit is proportional to an average of the magnitude of the input current.

19. The system of claim 17, wherein the first current sampling unit, the second current sampling unit and the third current sampling unit each comprise:
   a current mirror comprising a first transistor and a second transistor, the current mirror configured to:
      sample an input current during the first phase;
      copy a magnitude of the input current during the first phase;
      output from the first transistor a current comprising the magnitude of the input current during the second phase; and
   an error amplifier configured to keep a drain-source voltage of the first transistor approximately equal to a gate-source voltage of the first transistor during the second phase.

20. The system of claim 14, wherein the power converter circuit a buck power converter circuit.

* * * * *